United States Patent
Cascone et al.

(10) Patent No.: US 7,706,193 B2
(45) Date of Patent: Apr. 27, 2010

(54) VOLTAGE REGULATOR FOR THE PROGRAMMING CIRCUIT OF A MEMORY CELL

(76) Inventors: Davide Cascone, Via Adolfo Omodeo, 93, Napoli (IT) 80128; Nicola Del Gatto, Via Cimaglia, 7, Torre del Greco (IT) 80059; Emanuele Confalonieri, Via Riccardi, 21, Milano (IT) 20132; Massimiliano Mollichelli, Via Pirandello, 4, Campobasso (IT) 86100

( * ) Notice: Subject to any disclaimer, the term of this patent is extended or adjusted under 35 U.S.C. 154(b) by 80 days.

(21) Appl. No.: 11/964,250

(22) Filed: Dec. 26, 2007

(65) Prior Publication Data

US 2008/0094906 A1 Apr. 24, 2008

Related U.S. Application Data

(62) Division of application No. 11/280,803, filed on Nov. 16, 2005, now Pat. No. 7,388,793.

(51) Int. Cl.
*C11C 5/01* (2006.01)
(52) U.S. Cl. .................. 365/189.09; 365/191; 365/205; 365/206; 365/207
(58) Field of Classification Search ............ 365/189.05, 365/226, 227, 228, 189.09, 191, 207, 206, 365/205
See application file for complete search history.

(56) References Cited

U.S. PATENT DOCUMENTS

| 5,519,656 | A | * | 5/1996 | Maccarrone et al. ... 365/189.09 |
| 5,650,966 | A | * | 7/1997 | Cleveland et al. ......... 365/185.3 |
| 5,844,404 | A | * | 12/1998 | Caser et al. .................. 323/314 |
| 6,967,876 | B2 | * | 11/2005 | Rolandi et al. ......... 365/189.09 |
| 2002/0097627 | A1 | | 7/2002 | Sacco et al. |
| 2002/0122340 | A1 | | 9/2002 | Micheloni et al. |
| 2005/0254331 | A1 | | 11/2005 | Kuo |

OTHER PUBLICATIONS

Partial European Search Report, EP 05 02 5286, dated Feb. 28, 2006.

* cited by examiner

*Primary Examiner*—Pho M. Luu
(74) *Attorney, Agent, or Firm*—Trop, Pruner & Hu, P.C.

(57) ABSTRACT

A voltage regulator connected to a memory cell is configured by identifying at least a first and a second operation regions of the cell and associating the first and second operation regions with respective first and second operation conditions of the memory cell. An operative condition of the memory cell involved in a programming operation is detected, and at least a configuration signal of the regulator according to said detected operative condition is generated, this configuration signal taking a first and a second value associated with the first and second operation conditions.

19 Claims, 2 Drawing Sheets

VOLTAGE REGULATOR FOR THE PROGRAMMING CIRCUIT OF A MEMORY CELL

PRIORITY CLAIM

The present application is a divisional of U.S. application for patent Ser. No. 11/280,803 filed Nov. 16, 2005, which claims priority from Italian Patent Application No. MI2004A 002241 filed Nov. 19, 2004, the disclosures of which are hereby incorporated by reference.

BACKGROUND OF THE INVENTION

1. Technical Field of the Invention

The present invention relates to a method for configuring a voltage regulator. The invention particularly, but not exclusively, relates to a method for configuring a voltage regulator for the drain terminal of memory cells involved in a programming operation and the following description is made with reference to this field of application by way of illustration only.

2. Description of Related Art

As it is well known in this specific technical field, during the programming step of a Flash memory cell, it is important to set the voltage applied to the cell's terminals (Gate, Source, Drain, and Body). For multilevel Flash memories, where the cell is programmed at different threshold voltage values to memorize a number of bits greater than one, the stability of the voltage of these terminals becomes an even more critical issue.

In particular, in these multilevel Flash memories, the need for accurately controlling the threshold voltage value of each cell results in a slowdown of the programming operation with respect to the programming of single level memory devices.

The most used multilevel programming algorithm in fact provides a succession programming pulses and verify operations carried out on a group of cells to be programmed.

Each programming pulse increases the voltage value of the control or gate terminal of the cells involved in the programming operation, while the voltage value of another terminal, in particular the drain terminal, is kept constant.

Between a given programming pulse and the next following pulse, the memory cells are then subjected to a verify operation and, in case they have reached a desired state, i.e., they have a threshold voltage value within a desired distribution, they are disconnected from the group of cells to be programmed.

It is to be underscored that the drain voltage value is an important factor to realize a correct programming. In fact, a too low value of this drain voltage prevents a correct programming of the memory cell, while a too high value of this drain voltage could damage the cell itself.

The drain voltage value is usually obtained by means of a suitable drain voltage regulator connected to the group of memory cells.

In particular, this drain voltage regulator ensures, during each single programming pulse, that a constant voltage value is applied to the drain terminals of the cells to be programmed, in order to be able, in this way, to control the corresponding threshold variation of the cells caused by the programming pulse.

It is known to use drain voltage regulators with configurations of the source follower type that are able to keep as much stability as possible on the voltage supplied by the regulator itself.

This drain voltage is, in reality, a function also of the current absorbed by each memory cell involved in the programming operation. In particular, the current absorbed by the memory cell during a programming pulse depends on the resistive path existing between the source terminal of a pass-transistor used as a control element of the cell (and connected to the columns of the matrix of cells to be programmed) and the effective drain terminal of the cell to be programmed. In other words, the current absorbed by the cell depends on the group of cells involved in the programming operation, as well as on the multilevel value which is to be programmed.

This limit imposes restrictions to the multilevel programming operation preventing the optimization of the times necessary to conclude this operation.

Moreover, it has been observed how, during a programming pulse of a cell, the current absorbed thereby depends, as well, on the speed of the ramp that is used. In particular, the faster the ramp, the greater the current absorbed and, thus, the lower the control on the variation of the drain voltage of the cell itself.

In other words, reducing the time necessary for the programming operation would require the use of faster ramps which however imply a decrease of the control on the variation of the drain voltage and thus increase the risk of an incorrect programming of the cell.

Moreover, the drain voltage regulators realized according to the prior art are not able to face variations of the current absorbed by the cell, which causes a variation of the drain voltage, with consequent uncertainty about the outcome of the programming operation carried out on this cell.

There is accordingly a need for providing a voltage regulator able to provide a constant drain voltage value which is independent from the pattern of data to be programmed, so as to overcome the limits still affecting the regulators realized according to the prior art.

SUMMARY OF THE INVENTION

A voltage regulator connected to a memory cell is configured by identifying at least a first and a second operation region of said memory cell and associating said first and second operation regions with respective first and second operation conditions of said memory cell. An operative condition of said memory cell involved in a programming operation is detected, and at least a configuration signal of said regulator according to said detected operative condition is generated, this configuration signal taking a first and a second value associated with said first and second operation conditions.

A voltage regulator for a memory cell comprises at least one operational amplifier inserted between a first and a second voltage reference and having an input terminal connected to a further voltage reference as well as an output terminal suitable to supply a regulation signal. A variable regulation element is inserted between said first and second voltage references and connected to said output terminal of said operational amplifier, said variable regulation element being driven by means of a configuration signal generated according to an operative condition of said memory cell.

A programming circuit of a memory cell is connected to a supply voltage reference by means of a column decoding structure and an enable transistor. The circuit comprises at least one voltage regulator connected to said column decoding structure, wherein said regulator is connected to said column decoding structure by means of a configuration transistor.

Generally speaking, embodiments herein are directed to configuring a voltage regulator according to the current absorbed by the cell to be programmed during the different programming steps so as to keep a voltage value supplied by the regulator to a particular terminal of the cell constant.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
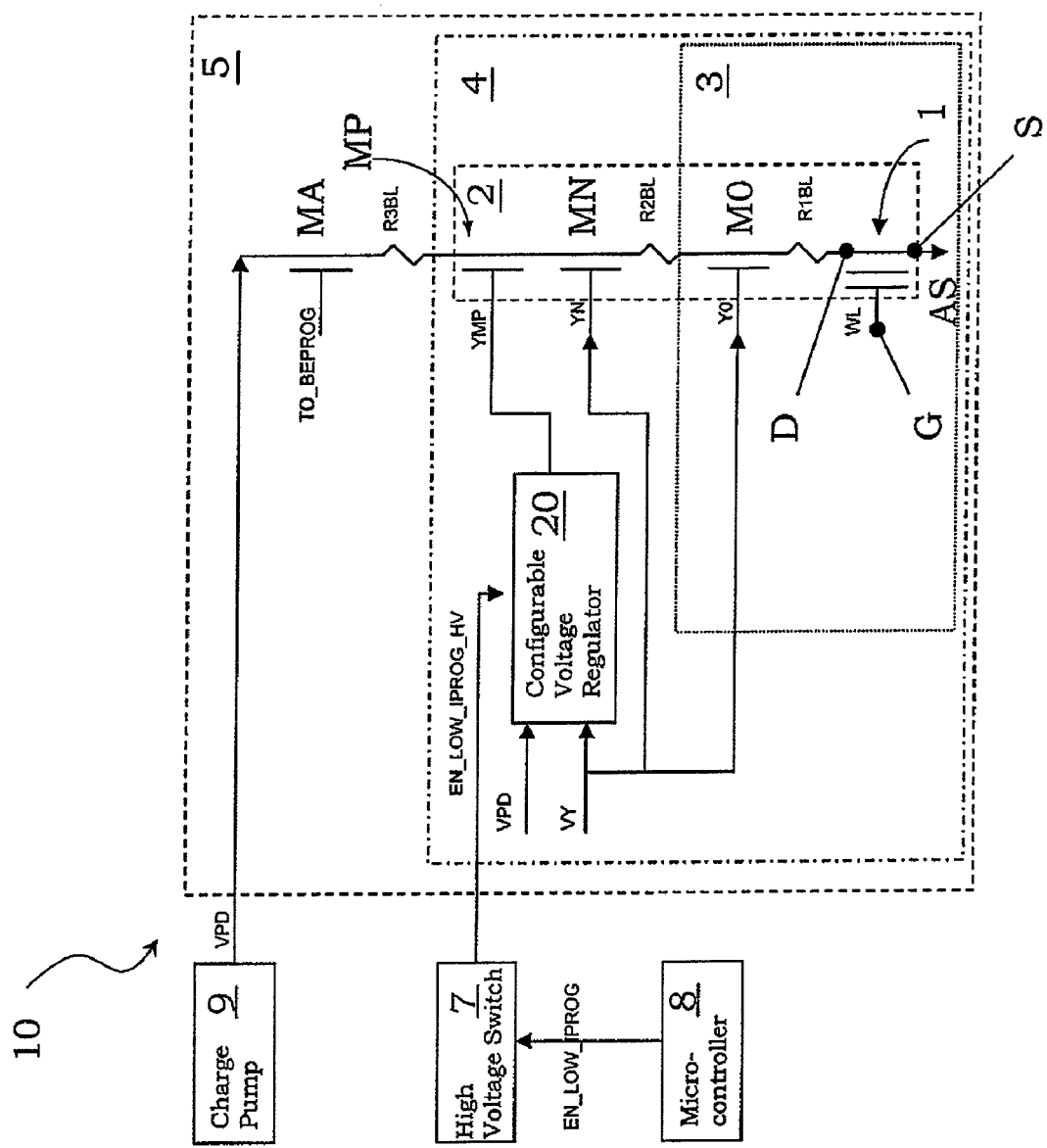
FIG. 1 schematically shows a programming circuit of a memory cell with configurable regulation suitable to implement methods in accordance with the invention.

With reference to the figures, element 10 globally indicates a programming circuit of a memory cell with a configurable regulation suitable to implement a regulation method according to embodiments of the invention.

In particular, the circuit 10 comprises a voltage regulator of the configurable type realized in accordance with an embodiment the invention (as globally indicated be reference number 20), to be used for the programming of a memory cell 1.

The memory cell 1 belongs to a memory matrix organized, in a known way, into rows and columns. In particular, the memory cell 1 belongs to a bit line 2 and to a sector 3 of a partition 4 of a bank 5 of the memory matrix.

In the example shown in FIG. 1, the memory cell 1 has a source terminal S connected to a source array reference voltage AS, a control or gate terminal G receiving a gate voltage WL, as well as a drain terminal D.

The drain terminal D is connected to the column decoding transistors, which are connected in series with each other. In particular, as shown in FIG. 1, the drain terminal D is connected, by means of a first resistor R1BL, to a first column decoding transistor M0, in turn connected, by means of a second resistor R2BL, to a second column decoding transistor MN.

These first and second resistors R1BL, R2BL schematize resistances present along the path of the column decoding and they are responsible for the variation of the voltage at the drain terminal D of the cell 1 to be programmed when the current absorbed during the programming pulse by the cell 1 itself varies.

In substance, the first M0 and second MN column decoding transistors as well as the first R1BL and second R2BL resistors realize a column decoding structure inserted between the supply voltage reference VPD and the drain terminal D of the memory cell 1.

The column decoding transistors M0, MN are also connected to a programming transistor MP, in turn connected, by means of a third resistor R3BL, to an enable transistor MA.

The enable transistor MA is inserted between a drain biasing voltage reference VPD and the programming transistor MP and it receives, on its control terminal, a first enable signal TO_BEPROG.

In particular, the enable transistor MA is a pass transistor driven by a selection algorithm of the cells to be programmed.

The control terminals of the decoding transistors M0, MN receive a first driving voltage VY, also used to supply the regulator 20. The regulator 20 also receives the voltage reference VPD.

Advantageously according to an aspect of the invention, the regulator 20 also receives a configuration signal EN_LOW_IPROG_HV obtained, by means of a high voltage switch 7, starting from an enable signal EN_LOW_IPROG.

In particular, the enable signal EN_LOW_IPROG is generated by a microcontroller 8 on the basis of the configuration method of the regulator 20 realized according to the invention, as it will be clarified in the following description.

Advantageously according to the invention, the regulator 20 is configured according to the current absorbed by the memory cell 1 to be programmed when the programming modes vary, thanks to the configuration signal EN_LOW_IPROG_HV applied to the regulator 20 itself and obtained starting from the enable signal EN_LOW_IPROG.

It is to be noted that the microcontroller 8 is usually comprised within the memory device and it is used for managing the modify algorithms of the memory itself, among which the programming algorithms. The microcontroller 8 could comprise any suitable programmable circuitry including, for example, dedicated combinatory logic circuitry.

The voltage reference VPD is obtained, in a known way, by means of a charge pump generator 9. This voltage reference VPD is used to bias the drain terminals D of the cells 1 to be programmed during a programming pulse.

Finally, the regulator 20 is output connected to the programming transistor MP to which it supplies a second driving voltage YMP.

Advantageously according to the invention, the second driving voltage YMP supplied by the regulator 20 is able to keep the voltage value of the drain terminal D of the cell 1 to be programmed constant and it respects the relation:

$$YMP < VY \qquad (1)$$

The regulator 20 is configured according to the current absorbed by the memory cell 1 to be programmed when the programming mode varies.

It is to be noted that, at least theoretically, different values of current absorption can be identified by the cell to be programmed. Advantageously according to the invention, the method for configuring a voltage regulator initially identifies two current limit values, corresponding to limit programming conditions of the memory cell 1, for which differentiation of the operation of the regulator 20 is interesting, advantageous and convenient.

In substance, the configuration method according to the invention provides the identification of two operation regions of the cell being programmed which operations are well defined and characterized by different values of the current absorbed.

It is to be noted that the regulation method according to the invention can be used also for memory cells to be programmed in a sector or in the memory matrix, for compensating the resistive drops on the local bit-lines or on the main bit-line, the drain voltage being in this case regulated upstream and not on the cell.

In a preferred embodiment of the configuration method according to the invention, these two programming limit conditions are:

first condition: a multilevel programming operation characterized in a slow programming ramp and by a low value of current absorption by the memory cell 1; and second condition: a single level programming operation (for example, all-zero) characterized by a fast programming ramp and by a high value of current absorption by the memory cell 1.

Advantageously according to the invention, the configuration method configures the regulator 20 according to a first and a second operation mode on the basis of these limit programming operations, so as to ensure that a constant voltage value is applied to the drain terminal D of the memory cell 1 to be programmed, independently from the value of the current absorbed thereby.

In this way, the method for configuring the regulator 20 according to the invention allows to avoid that the voltage of the drain terminal D of the memory cell 1 is lower than a fixed threshold, a condition for which a correct programming of the cell itself is not ensured, and at the same time it ensures that this voltage of the drain terminal D is not too high with the risk of damaging the memory cell 1 to be programmed.

In particular, the configuration method according to the invention configures the regulator 20 on the basis of the value of the configuration signal EN_LOW_IPROG_HV according to the following relations:

first operation mode of the regulator 20 triggered for a first value of the enable signal (for example EN_LOW_IPROG=1) in correspondence with the first programming limit condition (for example, multilevel programming); and second operation mode of the regulator 20 triggered for a second value of the enable signal (for example EN_LOW_IPROG=0) in correspondence with the second programming limit condition (for example, single level or all-zero programming).

It is to be remembered that a slow and fast programming ramp corresponds, respectively, to these first and second programming limit conditions.

Advantageously according to the invention, the configuration method according to the invention provides that this enable signal EN_LOW_IPROG, and in consequence the configuration signal EN_LOW_IPROG_HV, are activated and deactivated by the programming algorithm itself.

In this way, the desired configurability of the regulator 20 is implemented by passing the management of the configuration signals on inner algorithms which, according to the programming operation which is being performed, decide the operation region of the memory cell 1 and thus establish whether enabling or not a suitable enable signal (EN_LOW_IPROG) for the regions characterized by a low absorption current of the memory cell 1 involved in the programming operation.

In other words the configuration method according to the invention comprises the steps of:

identifying at least a first and a second operation regions of the cell 1;

associating these operation regions with respective first and second operation conditions of the cell 1;

detecting an operative condition of the cell 1 involved in a programming operation; and generating at least one configuration signal EN_LOW_IPROG_HV of the regulator according to the detected operative condition.

In particular, the configuration signal EN_LOW_IPROG_HV takes respective first and second values associated with the operation regions of the cell 1.

In the most general case, the method according to the invention provides the generation of more configuration signals according to a number of operative conditions identified being greater than two.

Moreover, the configuration method according to the invention further provides that the regulator 20 generates at least one regulation signal YMP for a regulation element connected to the cell 1.

In general, it is to be noted that the configuration method according to the invention can be also used in the case of drain voltages taking different values also inside a same operation, i.e., at different times of the algorithm. In particular, it is known to use a slow programming as long as the levels 10 and 01 are being programmed, followed by a fast programming for the level 00.

Moreover, it is possible to consider the case wherein the level 00 is used for example in a testing step with a fast ramp for time issues since it is necessary only to verify the integrity of the cells.

It is also possible to use the configuration method according to the invention in a differentiated way for the different cells which are programmed in parallel. In this case, each cell is associated with its own regulator which operates in an independent way from the others, plausibly the physical cells not programmable simultaneously—for example homologous bits of different bytes—being grouped and referred to a single regulator, so as to minimize the area occupation.

It is also possible to generalize the regulation method according to the invention by using more than two regulation values. By way of non limiting example, the case can be considered wherein a regulation value is added for carrying out the so called drain stress during a testing step. It is also possible to consider adding a regulation value to carry out the programming of reference values, programming which must be very precise.

Figures 2, 3:
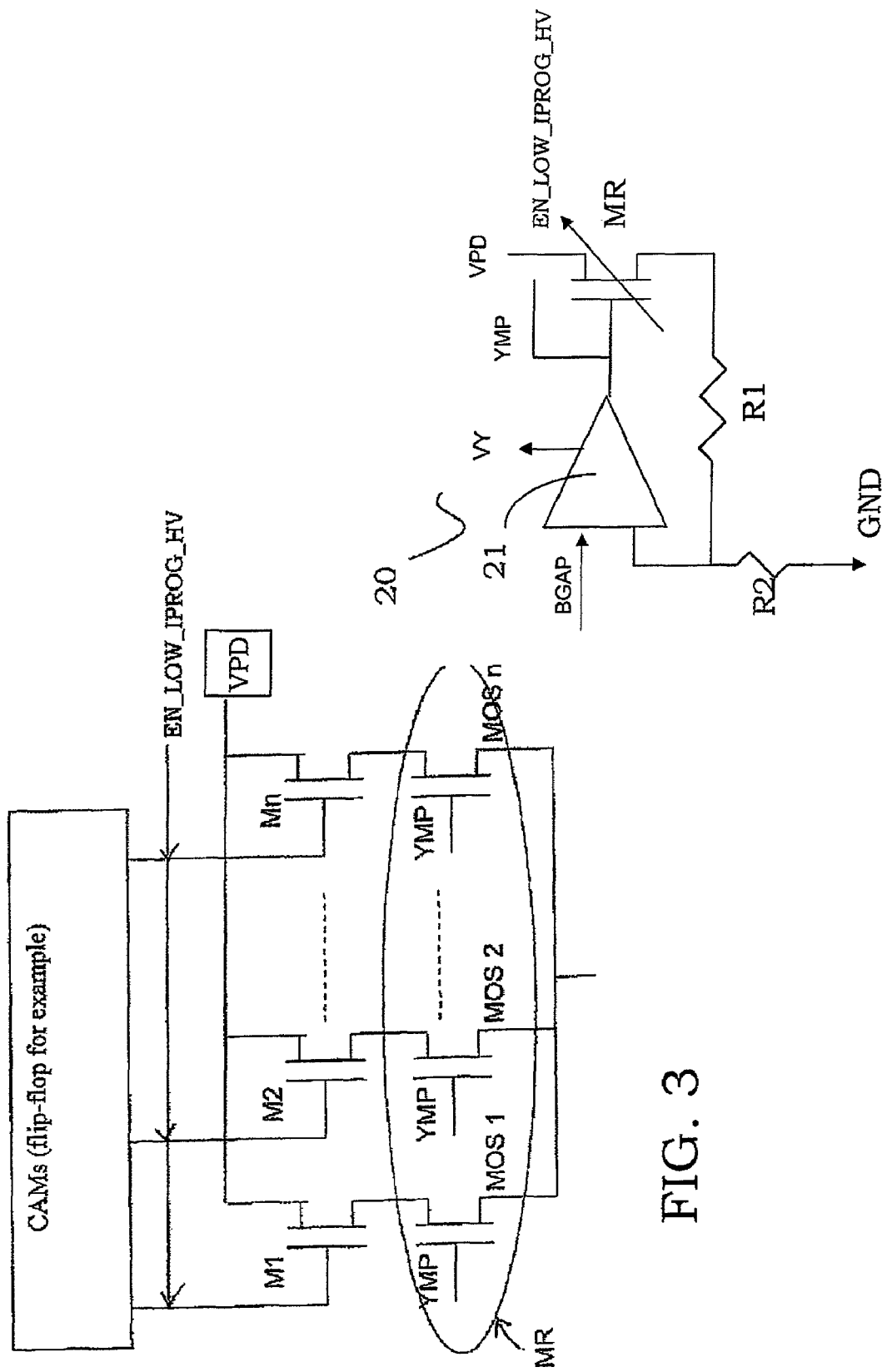
FIG. 2 schematically shows a configurable regulator realized in accordance with the invention.
FIG. 3 schematically shows a variable width transistor.

To realize a configurable regulator 20 able to implement the configuration method just described, a transistor is used with equivalent channel width suitably varied on the basis of the value of the configuration signal EN_LOW_IPROG_HV, as schematically shown in FIG. 2.

In particular, the regulator 20 comprises an operational amplifier 21 receiving, at a first input terminal, a constant reference voltage value BGAP, obtained for example by means of a bandgap circuit, and output connected to a variable regulation element, in particular a regulation transistor MR. The operational amplifier 21 is also supplied by the first driving voltage VY of the decoding transistors M0, MN.

The regulation transistor MR is inserted between the voltage reference VPD and, fed back by means of a first resistor R1, a second input terminal of the operational amplifier 21, in turn connected to a supply voltage reference, for example a ground GND by means of a second resistor R2. The resistances R1 and R2 are selected so as to replicate the resistance/impedance of the column decoding structure formed by MO, MN, R1BL and R2BL.

In particular, advantageously according to the invention, the regulation transistor MR has an equivalent channel width which is varied according to the configuration signal EN_LOW_IPROG_HV. The transistor MR is a metal level structure preferably integrated in a memory device including the memory cell 1. The configuration of the transistor MR is of well-known design and comprises a high voltage transistor comprising a plurality of high voltage MOS transistors (MOS1-MOSn) connected in parallel with each other (see, FIG. 3). Each of these transistors has an associated pass transistor (M1-Mn) which is used to enable/disable the connected high voltage MOS transistor. The signal EN_LOW_IPROG_HV comprises a multi-bit digital signal, where the individual bits of the signal are correspondingly connected to the gate terminals of the pass transistors. The equivalent channel width of transistor MR is thus varied in accordance with the signal EN_LOW_IPROG_HV by selectively enabling one or more of the high voltage MOS transistors through their associated pass transistors.

Moreover, at the output of an operational amplifier 21, the second driving voltage YMP for the programming transistor MP is picked up.

In substance, the configurability of the regulator 20 is obtained by varying the equivalent channel width of the regulation transistor MR according to the regulation signal EN_LOW_IPROG_HV.

It is to be highlighted the fact that the series connection of the transistor MR with the resistors R1, R2 of the regulator 20 allows to "copy" the situation which occurs in the column decoding of the memory matrix involved in the programming, i.e., the series of the transistor MP, driven by the second driving voltage YMP, and the current absorbed by the memory cell 1 to be programmed. Moreover, this "repetition" of conditions is true both in the case wherein the current absorption by the memory cell 1 is small, and in the case wherein this current absorption is big.

In a preferred embodiment, the resistive divider comprising the resistors R1 and R2 of the regulator 20 is realized by using diode-connected MOS transistors.

It is to be observed that the realization of this configurable regulator does not imply a significant increase of the silicon area used for the programming circuit 10. Moreover, the regulation value is independent from the number of cells to be programmed.

In substance, with respect to the regulators and to the programming circuits realized according to the prior art, two configuration transistors are added (MR, MP), in particular high voltage transistors MOS (HV) able to realize the configurability of the regulator 20 itself, as well as a high voltage switch 7, single for the whole memory device, for the management of the configuration signal EN_LOW_IPROG_HV since it is a high voltage signal.

The activation of the desired configuration during the various steps of the programming algorithms is advantageously managed by the microcontroller 8 by means of the generation of the enable signal EN_LOW_IPROG thanks to these configuration transistors MR, MP and to the high voltage switch 7 driven by the enable signal EN_LOW_IPROG coming from the microcontroller 8 to manage the switching of the driving high voltage signal of the configuration voltage, EN_LOW_IPROG_HV.

It is also possible to realize the configurability of the regulator 20 by using CAM cells or suitable metal options for the memory device. In the CAM implementation, as shown in FIG. 3, a CAM is connected to output the bits of the multi-bit signal EN_LOW_IPROG_HV. The memory elements of the CAM could comprise flip-flops in one implementation. The CAM is configured to memorize a plurality of channel width configurations which can then be selectively chosen and applied to the pass transistors (as discussed above) M1-Mn in order to enable corresponding high voltage MOS transistors MOS1-MOSn which comprise the transistor MR.

Moreover, the management of the configuration signals of the regulator 20 can be entrusted to a dedicated combinatory logic.

It is finally to be noted that the configuration method of the regulator 20 proposed allows to manage also programming steps with or without the body voltage (Vb=−1.2V).

The configuration method of the voltage regulator realized according to the invention shows an important advantage in the reduction of the programming time. In fact, thanks to the configurability obtained for the regulator 20, it is possible, in some steps of the programming algorithms, to use fast programming ramps also for multilevel programming.

Moreover, the configuration method according to the invention allows the circuit to reach the correct regulation of the voltage of the drain terminal of a cell involved in a programming operation when the current absorbed by the cell itself varies, by exploiting the programming algorithm of the cell since the current absorbed thereby is in turn a function of the programming mode (for example, in case a fast ramp or a slow ramp is used), i.e., of the programming algorithm being executed.

The configuration method uses a single configuration signal, which can be easily brought inside each partition of the memory device involved in the programming operation.

The configuration method proposed is also more efficient in terms of time with respect to those described in relation to the prior art, although without requiring an increase of the integration area of the programming circuit comprising the regulator implementing it, the only integration area increase being due to the high voltage switch 7 which, however, is single for the whole memory device.

It is to be further underscored the fact that the obtained regulation of the voltage value of the drain terminal of the cell involved in the programming operation is not influenced either by the number of the memory words or by the number of cells to be programmed.

Finally, it is to be highlighted that the regulator according to the invention has a particularly simple and compact configuration able to implement the method according to the invention in an intelligent way.

Although preferred embodiments of the device of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A voltage regulator for a memory cell, comprising:
   at least one operational amplifier inserted between a first and a second voltage reference and having an input terminal connected to a further voltage reference as well as an output terminal suitable to supply a regulation signal; and
   a variable regulation element inserted between said first and second voltage references and connected to said output terminal of said operational amplifier, said variable regulation element being driven by means of a configuration signal generated according to an operative condition of said memory cell.

2. The regulator according to claim 1, wherein said variable regulation element comprises a transistor with an equivalent channel width variable on the basis of the value of said configuration signal.

3. The regulator according to claim 1, wherein said variable regulation element is inserted between the first voltage reference and, fed back by means of a first resistive element, a second input terminal of said operational amplifier, in turn connected to said second voltage reference by means of a second resistive element.

4. The regulator according to claim 3, wherein said first and second resistive elements comprise respective diode-connected MOS transistors.

5. The regulator according to claim 1, wherein said variable regulation element comprises a plurality of CAM cells.

6. The regulator according to claim 1, wherein said variable regulation element comprises a metal level structure integrated in a memory device comprising said memory cell.

7. A programming circuit of a memory cell connected to a supply voltage reference by means of a column decoding structure and of an enable transistor and comprising at least one voltage regulator connected to said column decoding structure, wherein said regulator is connected to said column decoding structure by means of a configuration circuit to generate a configuration signal for said voltage regulator.

8. The programming circuit according to claim 7, wherein said voltage regulator is connected to a microcontroller by means of a high voltage switch, said microcontroller being dedicated to the management of modify algorithms of said memory cell, among which being a programming algorithm.

9. The programming circuit according to claim 8, wherein said high voltage switch is driven by an enable signal coming from said microcontroller and it allows to switch said enable signal into a configuration signal applied to said regulator.

10. The programming circuit according to claim 7, wherein said voltage regulator comprises:
at least one operational amplifier inserted between a first and a second voltage reference and having an input terminal connected to a further voltage reference as well as an output terminal suitable to supply a regulation signal;
a variable regulation element inserted between said first and second voltage references and connected to said output terminal of said operational amplifier, said variable regulation element being driven by means of a configuration signal generated according to an operative condition of said memory cell, and
wherein said first and second resistive elements of said regulator are chosen so as to replicate said column decoding structure.

11. The programming circuit according to claim 7, further comprising dedicated combinatory logic suitable to generate a configuration signal for said voltage regulator.

12. A circuit, comprising:
a voltage regulator of a memory device;
an input receiving a signal indicative of whether a memory cell of the memory device is to be operated with a multilevel programming operation or is to be operated with a non-multi level programming operation; and
a configuration circuit which generates a voltage regulator configuration signal, the voltage regulator configuration signal having a first state if the memory cell is to be operated with the multilevel programming operation, and having a second state if the memory cell is to be operated with the non-multi level programming operation.

13. The circuit of claim 12 wherein the voltage regulator:
generates a first gate drive voltage if the received voltage regulator configuration signal is in the first state; and
generates a second gate drive voltage if the received voltage regulator configuration signal is in the second state.

14. The circuit of claim 12 wherein said multilevel and non-multi level programming operations of said memory cell are characterized by different values of the current absorbed by said memory cell.

15. The circuit of claim 12 further comprising circuitry for executing a programming algorithm of said memory cell and managing generation of the voltage regulator configuration signal in either of the first and second states.

16. A circuit, comprising:
a voltage regulator in a memory device including a memory cell comprising a transistor having a drain terminal;
an input receiving a signal indicative of whether the memory cell is to be programmed in accordance with a first programming operation requiring a low current value at the drain terminal or in accordance with a second programming operation requiring a high current value at the drain terminal; and
a configuration circuit which generates a first configuration signal to the voltage regulator in response to a first programming operation determination and a second configuration signal to the voltage regulator in response to a second programming operation determination;
wherein the voltage regulator generates a control voltage whose level depends upon the applied first and second configuration signals.

17. The circuit of claim 16 wherein the control voltage from the voltage regulator is applied to stabilize a voltage at the drain terminal of the memory cell at substantially a same level for each of the first and second programming operations.

18. The circuit of claim 17 wherein the control voltage is applied as a gate control voltage of a transistor source/drain connected in series with a column decoder circuit which is connected to the drain terminal of the memory cell.

19. The circuit of claim 16 further comprising circuitry for executing a programming algorithm of said memory cell which manages application of the first and second configuration signals.

* * * * *